United States Patent [19]
Finkelstein et al.

[11] Patent Number: 5,556,530
[45] Date of Patent: Sep. 17, 1996

[54] FLAT PANEL DISPLAY HAVING IMPROVED ELECTRODE ARRAY

[75] Inventors: Walter Finkelstein, Rockville, Md.; John H. Hall, San Jose, Calif.

[73] Assignee: Walter J. Finklestein, Rockville, Md.

[21] Appl. No.: 460,784

[22] Filed: Jun. 5, 1995

[51] Int. Cl.$^6$ .............. C25D 5/02; C25D 7/12; C25D 5/34; C25D 9/04
[52] U.S. Cl. .......... 205/122; 205/123; 205/157; 205/205; 205/210; 205/219; 205/915; 205/640; 205/666; 216/79; 216/99
[58] Field of Search .................. 205/123, 122, 205/157, 205, 210, 219, 915; 427/525, 527, 528, 530, 577; 204/129.1, 129.65; 156/651.1, 657.1, 659.1

[56] References Cited

U.S. PATENT DOCUMENTS

| | | | |
|---|---|---|---|
| 3,863,332 | 2/1975 | Leupp et al. | 205/157 |
| 4,028,149 | 6/1977 | Deines et al. | 204/129.65 |
| 5,285,078 | 2/1994 | Mimura et al. | 257/3 |

OTHER PUBLICATIONS

*Hawley's Condensed Chemical Dictionary* no month (1987), p. 458.

*Primary Examiner*—John Niebling
*Assistant Examiner*—Edna Wong
*Attorney, Agent, or Firm*—Townsend and Townsend and Crew; Henry K. Woodward

[57] ABSTRACT

An array of electrodes for use in a flat panel display includes a plurality of electron emitters formed of polycrystalline or single crystalline silicon which has been selectively etched to form pores in the emitters. The electrode array is then electroplated in a methane plasma to deposit a carbon compound such as silicon carbide on the surfaces of the emitters and in the pores of the emitters. Each emitter has a generally flat electron emitting surface which facilitates a longer life for the electrode array, the porous structure of the emitters increasing the electron emission efficiency of the emitters in relatively low electric fields. The electrode array can be integral with a support substrate by anisotropically etching the substrate to form the emitters. A layered interconnect structure can be formed on a surface of the silicon substrate for providing the interconnect structure for the electrode array.

5 Claims, 1 Drawing Sheet

FLAT PANEL DISPLAY HAVING IMPROVED ELECTRODE ARRAY

BACKGROUND OF THE INVENTION

This invention relates generally to flat panel displays in which an array of field emitters are selectively energized to emit electrons for impinging on a phosphor-coated transparent faceplate, and more particularly the invention is directed to improved field emission electrodes for use therein.

In the conventional flat panel display, the emission electrodes of the array of field emitters are generally conically shaped elements of molybdenum, silicon, or active material which readily emits electrons when exposed to high electric fields. It is considered important to form a sharp tip electrode in order to achieve electron emission at reasonable voltages of approximately 200 volts. A very high electric field can be formed at the tip with an anode voltage on the order of 200 volts. The electrons then strike a phosphor-coated face plate to form a display image.

Problems with this emitter design are numerous and give rise to short lifetimes and a high cost of production. Polycrystalline silicon emitters are frequently used because of ease of formation by physical vapor deposition through an aperture mask. However, the silicon material is rapidly eroded during use and is easily vaporized by electrical arcing to the anode.

The present invention is directed to an improved silicon emission electrode structure having increased life and ease of manufacture.

SUMMARY OF THE INVENTION

In accordance with the invention, an electrode array for a flat panel display and the like comprises a supporting substrate with a plurality of electrodes extending from the support substrate, each of the electrodes comprising a body of porous silicon coated with a carbon compound film. The porous silicon can be formed by selectively electrolytically etching the silicon body in a hydrofluoric acid, and the carbon compound film can be electroplated on the array of electrodes in a methane gas plasma which forms a coating including silicon carbide.

In accordance with a feature of the invention, each of the electrodes has a generally flat surface for emitting electrons. Such a flat surface shape is readily formed by anisotropic etching of a suitably masked silicon substrate, as is conventionally employed in semiconductor device fabrication, to form truncated conical or cylindrical shaped electrodes.

The supporting substrate can comprise a silicon body on which a layered interconnect structure is formed by selectively depositing alternating conducting and insulating layers. Additionally, the silicon substrate can include implanted or diffused dopant ions to selectively form part of the interconnect structure.

The invention and objects and features of the invention will be more readily apparent from the following detailed description and appended claims when taken with the drawing.

DETAILED DESCRIPTION OF THE ILLUSTRATIVE EMBODIMENTS

Figure 1:
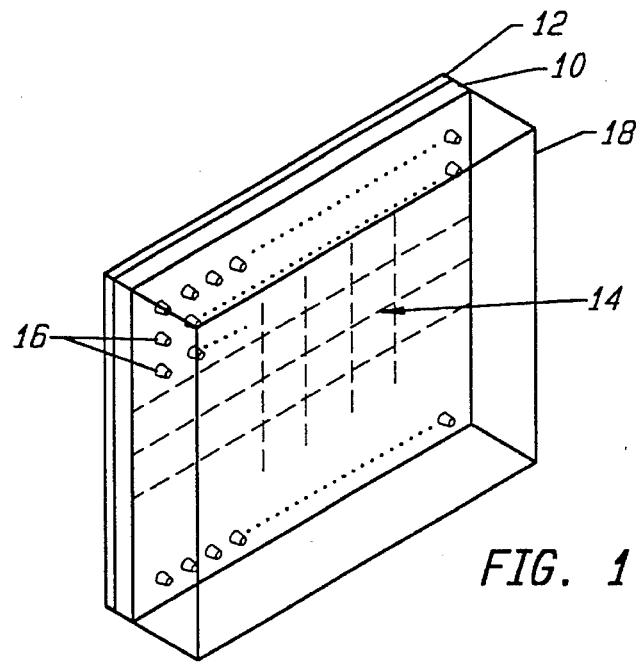
FIG. 1 is a perspective view of a flat panel display including an electron array in accordance with the invention.

Referring now to the drawings, FIG. 1 is a perspective view of a flat panel display including an electrode array in accordance with the invention. The display includes a support substrate 10 on which a layered interconnect structure or interconnect array 12 is formed. Substrate 10 can comprise single crystal or polycrystalline silicon, and the interconnect array 12 can comprise alternating insulative and conductive layers deposited on a first major surface of the silicon substrate to form an interconnect pattern shown generally at 14.

An array of electrodes 16 is formed on a second major surface of the substrate 10 which are selectively energized by the interconnect structure 14. A phosphor-coated transparent panel 18 is provided in spaced alignment from the electrodes 16. Panel 18 has a transparent conductive layer thereon, such as indium-tin, so that the phosphor layer can be grounded. When the electrodes 16 are selectively energized through the interconnect structure 14, electrons from the electrodes impinge on the phosphor-coated layer 18 which is normally maintained at a ground potential while the electrodes are energized at approximately 200 volts.

Figure 2:
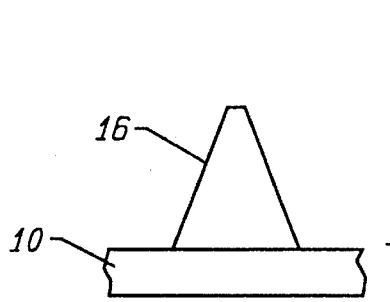
FIG. 2 is a side view of a field emitter of an electrode array in accordance with the prior art.

FIG. 2 is a side view of an electrode 16 in accordance with the prior art. As noted above, prior art electrodes have a sharp tip in order to cause the emission of electrons at reasonable voltages of approximately 200 volts. Heretofore the electrodes have been fabricated through use of a physical vapor deposition of electrode material through an aperture mask onto the supporting substrate 10. As further noted, the electrode material is eroded during use and easily vaporized by electrical arcing to the front face.

Figure 3:
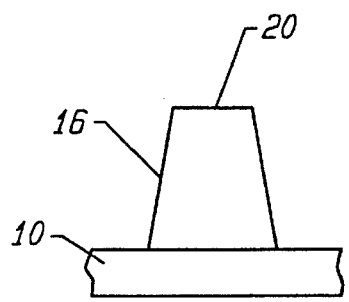
FIG. 3 and FIG. 4 are side views of field emitters in an electrode array in accordance with embodiments of the invention.
Figure 4:
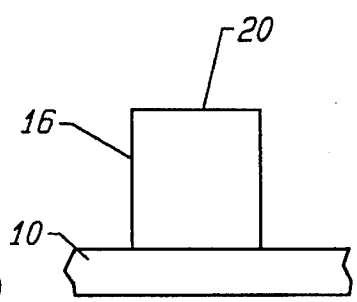

FIG. 3 and FIG. 4 are side views of electrodes in accordance with embodiments of the present invention. In both embodiments, the electrodes 16 have a generally flat surface 20 for the emission of electrons. While the flat surface tends to have a low emission efficiency, the fact that it is porous increases the efficiency markedly. Further, the carbon coating increases the life of the electrode. The electrodes are readily fabricated by anisotropically etching a masked surface of a silicon substrate so that the sides of the electrodes are perpendicular or nearly perpendicular to the substrate 10 from which they are etched. Such etching is conventional in silicon semiconductor device fabrication. While anisotropic etching is required to realize the structure of FIG. 4, isotropic etching as well as anisotropic etching can be employed in fabricating the structure of FIG. 3.

Figure 5:
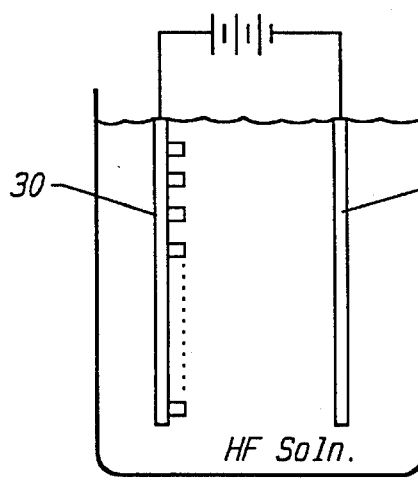
FIG. 5 illustrates a process for electrolytically etching pores in an electrode array in accordance with the invention.

To overcome the low emission efficiency of the electrode structures of FIGS. 3 and 4 in which the electron emission surface is generally flat, a porous matrix is electrolytically etched into the electrodes, which increases the electron emission efficiency in relatively low electric fields. This high emitter efficiency thus allows the use of flat topped structures as in FIGS. 3 and 4, which are longer lived, easy to form, and have more favorable emission characteristics than the prior art pointed electrode of FIG. 2. The porous structure is readily fabricated by electrolytically etching silicon electrodes on substrate 30 in a hydrofluoric acid electrolyte as illustrated in FIG. 5. The porous etch solution utilizes a 15–30% solution of hydrofluoric acid in water with an anode of platinum and an etching current of 20 to 100 mA per square inch.

Figure 6:
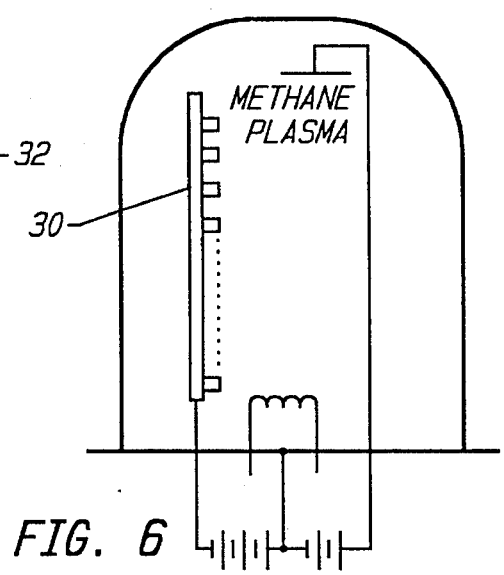
FIG. 6 illustrates a method of plasma electroplating surfaces of an electrode array to form a silicon compound coating on the array and in pores in the array.

The porous structure of the silicon electrode array can have a limited lifetime due to electrical erosion of the fine porous internal structure. However, this problem is overcome through the coating of the electrode surfaces and porous structures with a carbon compound such as silicon carbide. As illustrated in FIG. 6, this is accomplished by using a plasma electroplating technology in which a high temperature methane plasma deposits the carbon compound film on the electrode array 30. The methane plasma is generated by inductive coupled RF energy or an arc method at a pressure of 10 to 100 microns and concentrated by the magnetic field method. This plasma field is then used to bombard the emitter substrate by biasing the substrate to from 50 volts to 200 volts. Thus, a thin, diamond-like carbon film is formed on the internal structure as well as the external surface of the electrode array which provides a much more durable structure with a long lifetime and high emission efficiencies.

The electrode array in accordance with the invention provides increased life while maintaining emission efficiency as necessary in a flat panel display. While the invention has been described with reference to specific embodiments and applications, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating a field emission electrode array for a flat panel display comprising the steps of:
    (a) providing a support substrate having a silicon body with a first major surface,
    (b) selectively etching said major surface to form an array of electrodes extending from said substrate,
    (c) electrolytically etching pores in said array of electrodes, and
    (d) electroplating a film of a carbon compound on surfaces of said array of electrodes including in said pores.

2. The method as defined by claim 1 wherein step (b) includes anisotropically etching said major surface to form generally flat surfaces on said electrodes for emitting electrons.

3. The method as defined by claim 1 wherein step (c) includes selectively electrolytically etching said silicon body in hydrofluoric acid.

4. The method as defined by claim 1 wherein step (d) includes electroplating surfaces of said array of electrodes in a methane gas plasma to form silicon carbide.

5. The method as defined by claim 1 and further including the step of forming a layered interconnect structure on a second major surface of said support substrate for selectively energizing said array of electrodes.

* * * * *